United States Patent [19]

Stebani et al.

[11] Patent Number: 5,770,685
[45] Date of Patent: Jun. 23, 1998

[54] PHOTOLABILE POLYMERS WITH TRIAZENEDOR/AND PENTAZADIENE BUILDING BLOCKS

[75] Inventors: Jürgen Stebani, Krefeld; Oskar Nuyken, München; Peter Sluka, Weilheim; Peter Finckh, Diessen, all of Germany

[73] Assignee: Boehringer Mannheim GmbH, Mannheim-Waldhof, Germany

[21] Appl. No.: 606,682

[22] Filed: Feb. 26, 1996

Related U.S. Application Data

[63] Continuation of Ser. No. 221,796, Apr. 1, 1994, abandoned.

[30] Foreign Application Priority Data

Apr. 6, 1993 [DE] Germany .......................... 43 11 253.6

[51] Int. Cl.⁶ .................................................... C08G 83/00
[52] U.S. Cl. ......................... 528/422; 528/423; 525/540; 527/312; 527/200
[58] Field of Search .............................. 575/540; 528/422, 528/423; 527/200, 312

[56] References Cited

PUBLICATIONS

Remes et al., "Preparation of Pentazadiene Derivatives" (1973), Chem Abs #CA 79:31605.

Stebani et al., *Makromolekulare Chemie, Rapid Communications*, "Synthesis and characterization of a novel photosensitive triazene polymer", vol. 14, (1993) Jun., No. 6.

*Primary Examiner*—Ralph H. Dean
*Attorney, Agent, or Firm*—Nikaido, Marmelstein, Murray & Oram LLP

[57] ABSTRACT

The invention concerns the use of triazene or/and pentazadiene polymers as photoresists and in particular as positive photoresists in order to cover biochemical reagents. In addition the invention concerns a new process for the production of triazene or/and pentazadiene polymers.

5 Claims, 4 Drawing Sheets

MODEL COMPOUND

TRIAZENE POLYMER

TRIAZENE

PENTAZADIENE

POLYMER 1:

POLYMER 2:

Fig. 4
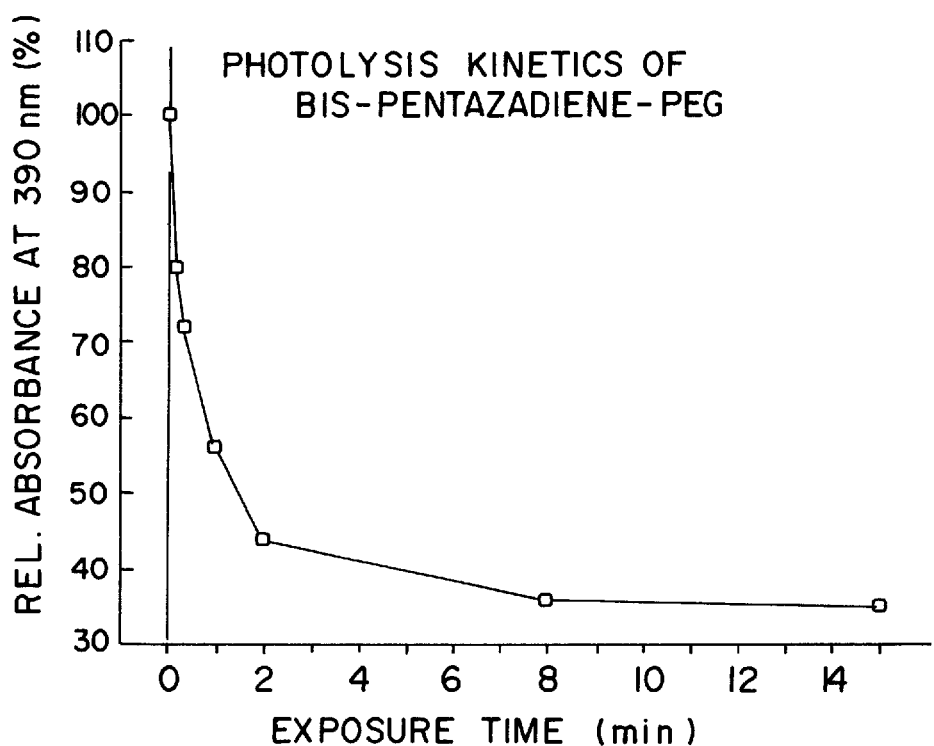
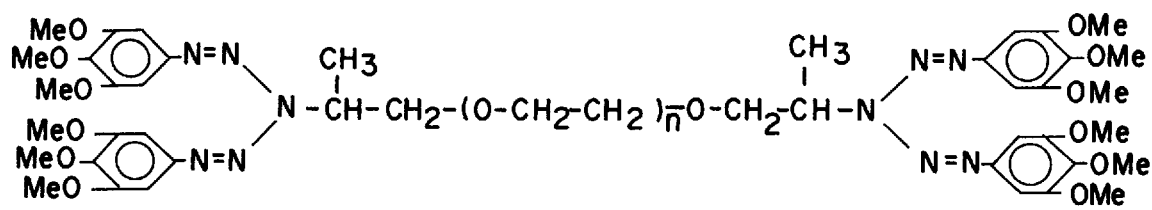
Fig. 4A

PHOTOLABILE POLYMERS WITH TRIAZENEDOR/AND PENTAZADIENE BUILDING BLOCKS

This application is a continuation of application Ser. No. 08/221,796 filed Apr. 1, 1994, now abandoned.

DESCRIPTION

The present invention concerns the use of triazene or pentazadiene polymers as photoresists and in particular as positive photoresists. In addition the invention concerns a process for the production of novel triazene or pentazadiene polymers as well as the products obtained by this process.

Photoresists are known from the production technology for electronic components. In a broad sense these are understood as radiation-sensitive and in special cases light-sensitive materials which change their solubility when they are irradiated. Depending on whether the solubility of the material is increased or decreased when acted upon by radiation it is denoted a positive or negative photoresist. This change in solubility due to photochemical or radiation-chemical reactions is usually a result of a decrease or increase in the molecular weight, a change in polarity or in molecular interactions of the resist components.

A short review of the function and chemical structure of current photoresists in commercial use is given by Steppan et al., "Angew. Chem." 94 (1982), 471–564 and Henkes, "Die Umschau" 1985, Vol 2. In these references diazonaphthoquinone, O-diazoquinone and O-nitrobenzyl ester systems are for example described as positive photoresists. A characteristic of these photoresists is that acid groups are formed after exposure of the materials to light. In this manner the resin components indeed become water soluble, but only at extreme pH values which is why the application of these systems in relation to biochemical reagents is possible only to a very limited extent.

Shirai et al., Macromol. Chem. 190 (1989), 2099–2107 describe the synthesis of positive photoresists which are developable in water at neutral pH and are polymers with iminooxysulfonyl groups. However, alkaline washing is necessary after development of these photoresists and consequently the possibility of application to the field of biochemistry is only very limited.

Ito and Willson, Polymer Eng. Sci. 23 (1983), 1012–1017 describe a dry, developable positive photoresist which is composed of poly(phthalaldehyde) and a cationic photoinitiator such as a diaryliodonium or triarylsulfonium metal halogenide. A disadvantage of this photoresist is, however, inter alia its low light sensitivity.

The triazenes or pentazadienes which have previously been described in the literature have mostly been confined to low molecular, monofunctional compounds i.e. compounds with one or two of these building blocks. Two previously described triazene polymers are exceptions (Behringer and Kohl, Chem. Ber. 89 (1956), 2648–2653, Hauser, J. Org. Chem. 29 (1964), 3449 and U.S. Pat. No. 3,431,251):

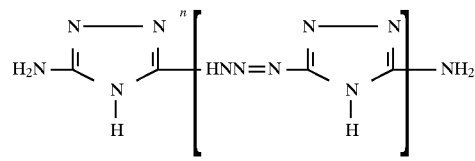

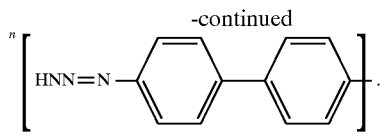

The linking unit of these polymers is formed by a so-called 1,3-diaryl-triazene unit in which two identical aromatic compounds build a polymer linked by triazene units. Two preparative variants are available for producing such polymers:

1. A bis(aminoaryl) compound "A—A" is diazotized only on one side to form an "A—B" building block and polymerized. The polymer which forms then has the theoretical sequence $(A—B)_n$.
2. A double diazotization of a bis(aminoaryl) compound "A—A" yields a "B—B" building block. Reaction of this molecule with an equimolar amount of the starting compound "A—A" yields a polymer with the theoretical sequence $(A—AB—B)_n$.

Only poly(bis-aryltriazenes) can be obtained by the polymerization reactions described above for the formation of triazene polymers. Production of pentazadiene polymers is not possible by this method.

The use of triazene polymers as photoresists was also previously unknown.

An object of the present invention was to provide new photoresists which in particular are suitable for applications in biochemical methods.

This object is achieved according to the invention by the use of triazene or/and pentazadiene polymers as photoresists and in particular as positive photoresists. The term "triazene or/and pentazadiene polymer" according to the present invention encompasses triazene, pentazadiene and triazene-pentazadiene mixed polymers. The term encompasses those polymers which have building blocks linked by triazene or/and pentazadiene groups and also those polymers which have building blocks linked by other bonds (e.g. peptide bonds, ether bonds) and in which triazene or/and pentazadiene functional groups are located at the ends or/and on the side groups of the polymer.

A surprising advantage of the use of triazene and pentazadiene polymers as photoresist materials is due to the higher rate of the photolysis reaction with these substances. Depending on the starting compound for the synthesis, polymers may be prepared which can either be used as positive photoresists (sites exposed to light dissolve better in the developer than unexposed sites) or also as negative photoresists (sites exposed to light dissolve less well in the developer than unexposed sites).

A feature of the triazene polymer class in this process is their high thermolysis resistance, in general the decomposition temperatures of the polymers extend up to 250° C. In contrast pentazadiene polymers are generally only stable up to about 100° C., but they have a considerably higher photolysis rate.

A particular advantage of the use of triazene and pentazadiene polymers as positive photoresists is that the polymer fragments which are formed after exposure to light are also water-soluble at neutral pH values and as a result they can be applied excellently to the field of biochemistry and in the very pH-sensitive biological reagents which are used in this case.

Triazene and pentazadiene polymers can thus for example be used as photolabile protective layers for covering biochemical reagents. Such a covering is for example necessary in a method for the determination of an analyte in which several reagents have to be brought into contact with the sample at different times without the necessity for a subsequent addition of a reagent. Such a method could for example be carried out in such a way that a first reagent is present in a reaction vessel in a form which is immediately soluble on addition of sample liquid, while a second reagent and if desired further reagents are enclosed by protective layers with delayed solubility which prevent a premature contact of the reagents located under them with the sample liquid. When using photolabile protective layers composed of triazene or pentazadiene polymers it is possible to vary within wide limits the time of the reaction of the first reagent with the sample liquid in a simple manner by merely having to irradiate the protective layer with light of a suitable wavelength at the desired starting time for the second partial reaction. The resulting destruction of the protective layer results in an immediate contact of the sample liquid with a reagent located under the protective layer. If desired it is also possible to place a further closed intermediate layer which contains no specific reagents between the base layer on the reaction vessel containing the second reagent and the protective layer comprising the positive photoresist.

A particular preferred aspect of the invention is therefore the use of triazene or/and pentazadiene polymers as positive photoresists in a method for the determination of an analyte in a sample liquid by a reaction proceeding in several steps which are separated in time. Such a method is preferably characterized in that the sample liquid containing the analyte is added to a reaction vessel which contains at least two reagents required to carry out the determination reaction that are in a form which is readily soluble in the sample liquid and are spatially separated from one another, wherein a first reagent intended for the first reaction step is in a form which is soluble without delay in the sample liquid, while a second reagent intended for the second reaction step and if desired further reagents are separated from one another and from the first reagent and are protected from an immediate contact with the sample liquid by protective layers wherein the protective layers are designed in such a way that they enable a time-delayed contact between the sample liquid containing the analyte and the reagent located under the respective protective layer so that a reaction of the analyte with the reagents can take place in several steps which are separated from one another in time and the analyte can be determined after the reaction is completed in a homogeneous liquid phase.

The present invention also concerns a process for the production of novel triazene or pentazadiene polymers which is characterized in that a bifunctional aromatic or heteroaromatic amino compound is converted by diazotization into a corresponding bis-diazonium salt and this is subsequently reacted with a compound containing amino groups in a polycondensation reaction to produce a polymer, wherein (a) a bifunctional primary or secondary amine of the general formula (I)

$$R^1—NH—Z—NH—R^2 \quad (I)$$

is used as the compound containing amino groups, in which Z represents a non-aromatic hydrocarbon group which is substituted if desired or a polymeric residue, $R^1$ and $R^2$ are the same or different and each represents hydrogen, an aliphatic, unsaturated or/and aromatic hydrocarbon group which is substituted if desired or polymeric residue, or/and (b) a primary amine of the general formula (II)

$$H_2N—R^3 \quad (II)$$

is used as the compound containing amino groups, in which $R^3$ represents hydrogen, an aliphatic, unsaturated or/and aromatic hydrocarbon group which is substituted if desired, an alkoxy group or a polymeric residue.

According to variant (a) of this process a triazene polymer with the linking unit $$[—N=N—A—N=N—\underset{R^1}{\overset{\mid}{N}}—Z—\underset{R^2}{\overset{\mid}{N}}—] \quad (IV)$$

is formed in which A is the residue of a bifunctional aromatic or heteroaromatic amine compound after diazotization and subsequent reaction of the two amino groups and $R^1$, $R^2$ and Z are defined as above.

The symbol Z in the formulae (I) and (IV) denotes a non-aromatic hydrocarbon group which is substituted if desired or a polymeric residue. Z preferably denotes a $C_1$–$C_8$ hydrocarbon group substituted if desired with ether or alkylamino bridges such as a $(CH_2)_2$ or a $(CH_2)_6$ group.

The symbols $R^1$ and $R^2$ in the formulae (I) and (IV) can be the same or different and each denotes hydrogen, an aliphatic, unsaturated or/and aromatic hydrocarbon group which is substituted if desired or a polymeric residue. If $R^1$ and $R^2$ are hydrogen, the polymers which are formed are arylmonoalkyl triazenes. If $R^1$ and $R^2$ are alkyl groups, the polymers which are formed are aryldialkyl-triazenes and if $R^1$ and $R^2$ are aromatic or heteroaromatic residues (e.g. phenyl, substituted phenyl, pyridine, triazole etc.), the polymers which are formed are bisaryltriazenes. $R^1$ and $R^2$ are each preferably hydrogen or a $C_1$–$C_4$ alkyl group. In this connection it should be noted that in the present description the term "aryl" also encompasses O-, S- or/and N-heteroaromatic compounds. It should also be made clear that the representations of benzene rings shown in formulae (III) and (VI) can also denote other aromatic ring systems and in particular heteroaromatic rings.

In variant (b) of the process described above pentazadiene polymers are formed with the linking unit $$[—A—N=N—\underset{R^3}{\overset{\mid}{N}}—N=N—] \quad (V)$$

in which A is the residue of a bifunctional aromatic or heteroaromatic amino compound after diazotization and subsequent conversion of both amino groups and $R^3$ is as defined above in formula (II).

If $R^3$ is hydrogen, the primary amine of formula (II) is ammonia. The pentazadiene formed in the reaction of ammonia with a bifunctional aromatic or heteroaromatic amine compound is an unsubstituted pentazadiene. On the other hand $R^3$ can also be an aliphatic or unsaturated hydrocarbon group which is substituted if desired. In this case the polymer which forms is a $N_3$-alkylpentazadiene or $N_3$-alkenylpentazadiene. Suitable substituents of the alkyl or alkenyl group are for example aryl, heteroaryl, O-alkyl, carboxyl groups, halogen, CN, thioether, dialkyl-amino groups and sulfonic acid groups.

$R^3$ can in addition be an aromatic hydrocarbon group which is substituted if desired. If $R^3$ is an aromatic residue (i.e. the compound $H_2N—R^3$ is an aniline derivative), the polymer which forms is a $N_3$-aryl pentazadiene. $R^3$ in such aniline derivatives can be an unsubstituted aryl or heteroaryl residue or a substituted aryl or heteroaryl residue. Examples of suitable substitutents are $C_1$–$C_4$ alkyl, $C_1$–$C_4$ alkoxy, CN, dialkylamino, thioether, aryloxy, halogen, N=N-aryl, sulfonic acid and carboxylic acid groups.

$R^3$ is preferably a $C_1$–$C_8$ alkyl group which is substituted if desired, such as an ethyl, butyl or an ethylsulfonic acid group.

The process according to the invention for the production of triazene or pentazadiene polymers is preferably carried out by diazotizing the bifunctional aromatic or heteroaromatic amine compound by addition of a solution containing nitrite ions at a temperature of −10° C. to +25° C. in the presence of a non-oxidizing acid to form a corresponding bis-diazonium salt.

The bis-diazonium salt as a freshly prepared solution or also as a solution or suspension of an isolated diazonium salt can be reacted with the compound containing amino groups in a polycondensation reaction. The reaction of the bis-diazonium salt and compound containing amino groups can take place in aqueous solution in an alkaline pH range and preferably at ca. 0° C. On the other hand the reaction can also be carried out as an interfacial polycondensation. For this the compound containing amino groups is dissolved in an inert organic solvent (e.g. n-hexane) which is immiscible with water. This solution is subsequently dispersed in distilled water which has been brought into an alkaline pH range by addition of a base (e.g. NaOH or $Na_2CO_3$). After addition of a solution of the bis-diazonium salt, the polymer is formed at the interface between the aqueous and organic phase.

In a preferred embodiment of the method according to the invention a bis(aminoaryl) compound is used as the bifunctional amino compound. A bis(aminoaryl) compound of the general formula (III) is preferably used

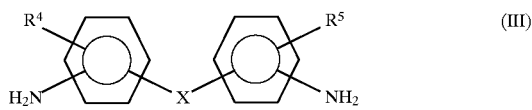

in which X denotes a chemical bond, O, S, S—S, SO, $SO_2$, CO, CO—NH, CS, N=N, NH, N(alkyl), Y, COO, $SO_2$— NH, NH—Y—NH, NH—CO—NH, NH—$SO_2$—NH or a saturated or unsaturated hydrocarbon group, $R^4$ and $R^5$ are the same or different, represent one or several substituents on the aromatic ring and each denotes H, $C_{1-4}$ alkyl, $C_{1-4}$ alkoxy, Y, CN, N(alkyl)$_2$, halogen, N=N—Y, thioether, —OY, $SO_3H$, $CO_2H$ or their salts and Y denotes an aromatic or non-aromatic cyclic hydrocarbon group which is substituted if desired. The symbol X in the general formula (III) preferably denotes a chemical bond, O, CO—NH, NH or a $C_1$–$C_6$ hydrocarbon group (e.g. $CH_2$, $(CH_2)_2$, CH=CH etc.).

The symbols $R^4$ and $R^5$ in the general formula (III) preferably denote hydrogen, $C_1$–$C_4$ alkyl (e.g. $CH_3$, $C_2H_5$) or $C_1$–$C_4$ alkoxy (e.g. $OCH_3$, $OC_2H_5$).

On the other hand it is also possible to use a mono-aromatic or mono-heteroaromatic compound as the bifunctional amino compound. Examples of mono-aromatic compounds are for instance phenylenediamines and phenylenediamines substituted on the benzene ring. Examples of mono-heteroaromatic compounds are for instance N-heteroaromatic compounds with one or several N atoms in the aromatic ring e.g. 3,5-diamino-1,2,4-triazole.

The symbols Z, $R^1$, $R^2$ and $R^3$ in compounds of the general formulae (I) and (II) can also represent a polymeric residue. This polymeric residue is preferably derived from an amino-functional polymer selected from the group comprising polyethylenes, poly(allyl)amines, polyethers, polyethylenimines, polysaccharides or polypeptides. The polymeric residue is particularly preferably derived from a polyether, in particular from an amino-terminal polyethylene oxide, polypropylene oxide or poly-(ethylenepropylene) oxide.

In yet another embodiment of the process according to the invention triazene or/and pentazadiene polymers which are suitable as photoresists for the use according to the invention can be produced by converting a monofunctional aromatic or heteroaromatic amino compound by diazotization into a corresponding mono-diazonium salt and subsequently reacting this with an amino-functional polymer in a condensation reaction to produce a triazene or/and pentazadiene polymer.

The amino-functional polymer is preferably selected from the group comprising amino-functional polyethylenes, poly (allyl)amines, polyethers, polyethylenimines, polysaccharides or polypeptides. The amino-functional polymer is preferably an amino-terminal polyethylene oxide, polypropylene oxide or poly(ethylenepropylene) oxide. In this manner it is for example possible to produce polymers with triazene or/and pentazadiene groups from water-soluble polymers (with free amino groups) by reaction with diazonium salts, the water-solubility of which is considerably less than that of the starting polymers. Cleavage of the triazene or/and pentazadiene groups by exposure to light in turn produces the original water-soluble polymer so that in an application as a protective layer to cover biochemical reagents the reagents located under this can dissolve.

If a polymer with secondary amino groups is used in this variant of the process, then a triazene polymer is obtained as the reaction product. If in contrast an amino-functional polymer with primary amino groups is used and the diazonium salt is used in a two-fold or higher excess in relation to the primary amino groups of the polymer, then the reaction product obtained is a polymer which has mainly pentazadiene functional groups. Mixed polymers can be produced in a corresponding manner which have triazene as well as pentazadiene functional groups.

The diazotization of the monofunctional aromatic or heteroaromatic amino compound is preferably carried out by adding a solution containing nitrite ions at a temperature of −10° C. to +10° C. in the presence of a non-oxidizing acid e.g. HCl. An aniline derivative of the general formula VI can be preferably used as the mono-functional aromatic or heteroaromatic amine compound

in which $R^6$ represents one or several substituents on the aromatic ring and each can denote hydrogen, $C_{1-4}$ alkyl, $C_{1-4}$ alkoxy, —Y, —CN, N(alkyl)$_2$, halogen, N=N—Y, thioether, —OY, —$SO_3H$, —$CO_2H$ or their salts and Y denotes an aromatic or non-aromatic cyclic hydrocarbon group which is substituted if desired.

A preferred example of an aniline derivative is 3,4,5 (trimethoxy)aniline.

The present invention in addition concerns polymers with triazene or/and pentazadiene functional groups which can be obtained by reaction of amino-functional polymers with monodiazonium salts.

It is intended to further elucidate the invention by the following examples in conjunction with FIGS. 1 to 4.

FIG. 4 shows the photolysis kinetics of a bis-pentazadiene-polyethylene glycol.

EXAMPLE 1

Figure 1:
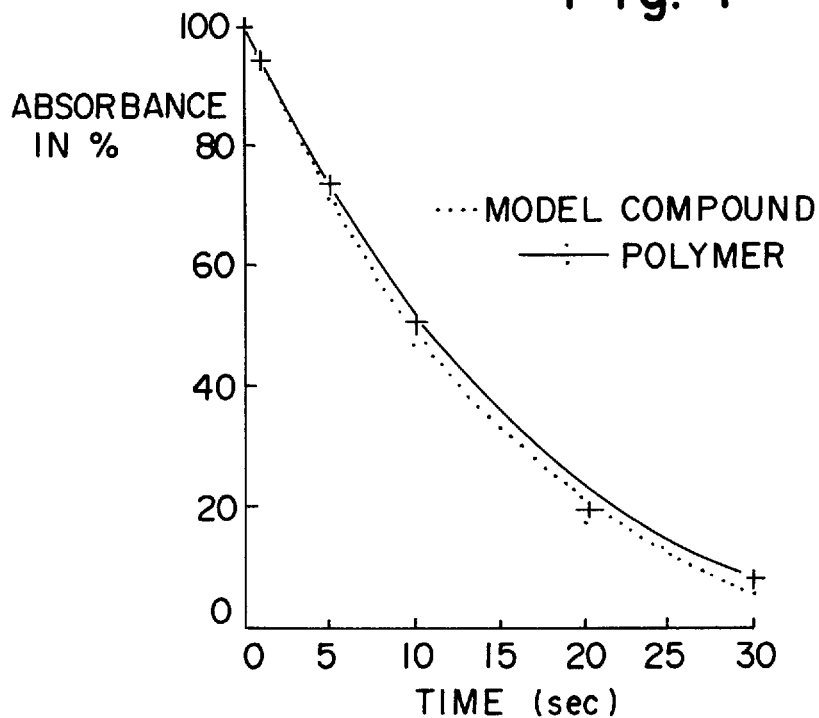
FIG. 1 shows the photolysis kinetics of a triazene polymer and its corresponding monomer.
Figure 1A:
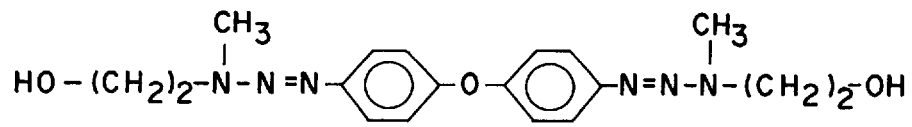
Figure 1B:
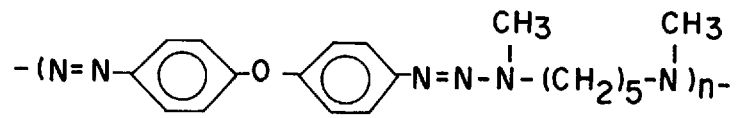

0.01 mol (2.00 g) bis-(4-aminophenyl)ether is dissolved at a temperature of −10° to 0° C. in 25 ml dilute aqueous mineral acid (e.g. 10% HCl). The corresponding bis-diazonium salt is obtained by addition of an aqueous solution of 0.02 mol (1.38 g) sodium nitrite cooled to 0° C., wherein the reaction period until the diazotization reaction is completed depends on the bis-(aminophenyl) compound used.

The bis-diazonium salt solution obtained in this manner is adjusted to an alkaline pH range by addition of 175 ml of an aqueous solution of a base (8.0 g sodium carbonate) cooled to 0° C. and admixed while stirring vigorously with an aqueous solution of 0.01 mol 1,6-bis(methylamino)hexane in 100 ml n-hexane which is cooled to 0° C. The reaction mixture is stirred for a further 1 hour at 0° C. and subsequently the triazene polycondensate TP1 is filtered, washed with distilled water and dried.

The triazene polymers TP1–TP13 listed in Table 1 are produced in an analogous manner according to the above description for the synthesis:

TABLE 1

$$(-N=N-\underset{R^4}{\underset{|}{\bigcirc}}-X-\underset{R^4}{\underset{|}{\bigcirc}}-N=N-\underset{R^1}{\underset{|}{N}}-Z-\underset{R^1}{\underset{|}{N}}-)_n$$

| Polymer | Starting materials | X | R$^4$ | R$^1$ | Z |
|---|---|---|---|---|---|
| TP1 | 1,6-bis(methylamino)hexane bis(4-aminophenyl)ether | O | H | CH$_3$ | (CH$_2$)$_6$ |
| TP2 | 1,2-bis(methylamino)ethane bis(4-aminophenyl)ether | O | H | CH$_3$ | (CH$_2$)$_2$ |
| TP3 | 2,3,5,6-tetramethyl-p-phenylenediamine bis(4-aminophenyl)ether | O | H | H | tetramethylphenylene |
| TP4 | 1,2-bis(methylamino)ethane 4,4'-di-aminostilbene-2,2'-disulfonic acid | CH=CH | SO$_3^-$Na$^+$ | CH$_3$ | (CH$_2$)$_2$ |
| TP5 | 1,6-bis(methylamino)hexane 4,4'-di-aminostilbene-2,2-disulfonic acid | CH=CH | SO$_3^-$Na$^+$ | CH$_3$ | (CH$_2$)$_6$ |
| TP6 | 2,4,6-trimethyl-m-phenylenediamine 4,4'-diaminostilbene-2,2'-disulfonic acid | CH=CH | SO$_3^-$Na$^+$ | | trimethylphenylene |
| TP7 | 1,3-bis(methylamino)propane bis(4-aminophenyl)ether | O | H | CH$_3$ | (CH$_2$)$_3$ |
| TP8 | 1,4-bis(methylamino-2-butene bis(4-aminophenyl)ether | O | H | CH$_3$ | —CH$_2$—CH=CH—CH$_2$— |
| TP9 | 1,8-bis(methylamino)-3,6-dioxaoctane bis(4-aminophenyl)ether | O | H | CH$_3$ | —(CH$_2$)$_2$—O—(CH$_2$)$_2$—O—(CH$_2$)$_2$— |
| TP10 | 1,6-bis(methylamino)hexane 4,4'-di-aminostilbene | CH=CH | H | CH$_3$ | (CH$_2$)$_6$ |
| TP11 | 1,6-bis(methylamino)hexane 4,4'-di-aminobenzophenone | C=O | H | CH$_3$ | (CH$_2$)$_6$ |
| TP12 | 1,6-bis(methylamino)hexane bis(4-aminophenyl)sulfone | SO$_2$ | H | CH$_3$ | (CH$_2$)$_6$ |
| TP13 | 1,6-bis(methylamino)hexane (4,4'-diaminodiphenyl)sulfide | S | H | CH$_3$ | (CH$_2$)$_6$ |

EXAMPLE 2

Synthesis of pentazadiene polymers by polycondensation 0.01 mol (2.00 g) bis-(4-aminophenyl)ether was dissolved at a temperature of −10° to 0° C. in 25 ml dilute aqueous mineral acid (e.g. 10% HCl). The corresponding bis-diazonium salt is obtained by addition of an aqueous solution of 0.02 mol (1.38 g) sodium nitrite cooled to 0° C., wherein the reaction period until the diazotization reaction is completed depends on the bis-(aminophenyl) compound used.

The bis-diazonium salt solution obtained in this manner is adjusted to an alkaline pH range by addition of an aqeuous solution of a base (e.g. 8.0 g sodium carbonate) cooled to 0° C. and admixed while stirring vigorously with an aqueous solution of 0.01 mol butylamine which is cooled to 0° C. The reaction mixture is stirred for a further 1 hour at 0° C. and subsequently the pentazadiene polycondensate PP1 is filtered, washed with distilled water and dried.

Figure 3:
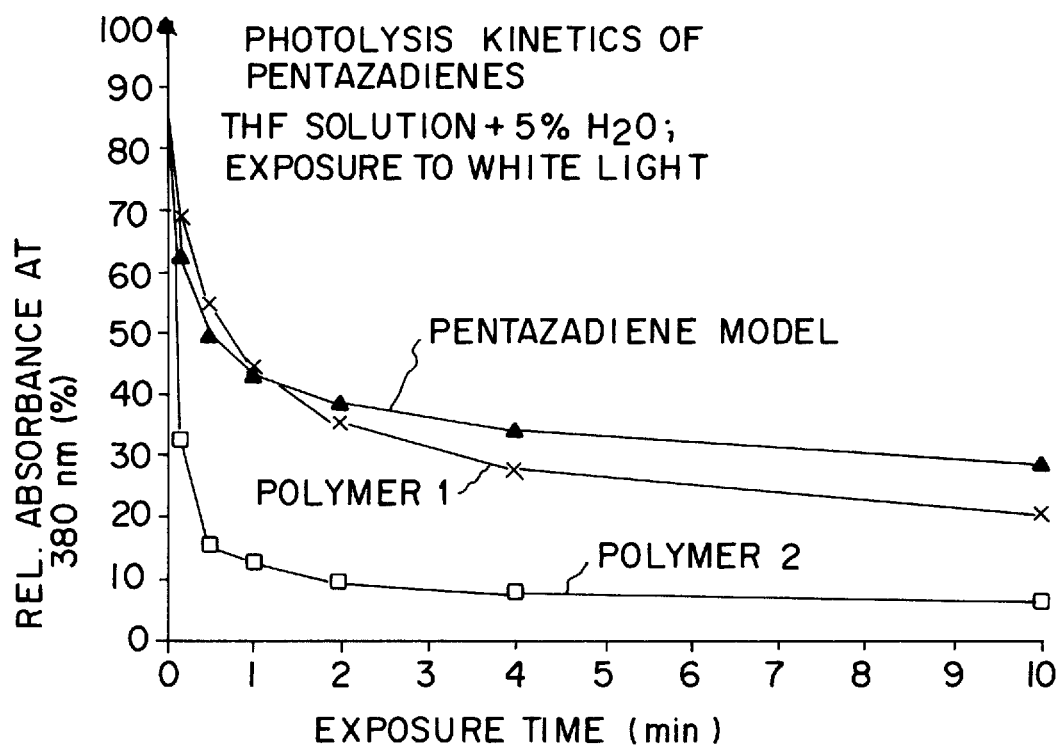
FIG. 3 shows the photolysis kinetics of two pentazadiene polymers and a monomeric pentazadiene compound when irradiated with white light.

The pentazadiene polymers PP2 to PP7 listed in Table 2 are produced in an analogous manner according to the above description for the synthesis:

380 nm. FIG. 3 shows the time course of the photolysis kinetics of two pentazadiene polymers and a monomeric pentazadiene compound (compounds corresponding to example 3.2)

3.4 Bis-pentazadiene-polyethylene glycol

The experiment was carried out as described in 3.3. FIG. 4 shows the photolysis kinetics of a bis-pentazadiene-polyethylene glycol.

As in the previous experiments the residue from the irradiation of the polymer is again readily water-soluble. Likewise a good film formation is observed.

This bis-pentazadiene-polyethylene glycol was produced from an amino-terminal polyethylene glycol with a mol mass of ca. 1900.

TABLE 2

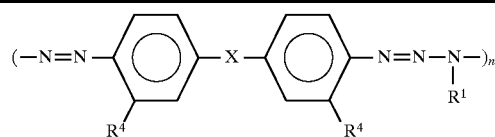

| Polymer | Starting materials | X | $R^1$ | $R^4$ |
|---|---|---|---|---|
| PP1 | butylamine bis(4-aminophenyl)ether | O | Butyl | H |
| PP2 | butylamine 3,3'-dimethoxy-benzidine | — | Butyl | OMe |
| PP3 | ethylamine bis(4-aminophenyl)ether | O | Ethyl | H |
| PP4 | taurine bis(4-aminophenyl)ether | O | $CH_2-CH_2-SO_3^-Na^+$ | H |
| PP5 | ethylamine 4,4'-diaminobenzanilide | CO—NH | Ethyl | H |
| PP6 | ethylamine 4,4'-diaminostilbene | CH=CH | Ethyl | H |
| PP7 | ethylamine bis(4-aminophenyl)amine | NH | Ethyl | H |

EXAMPLE 3

Photolysis of triazene and pentazadiene polymers in solution
3.1 Triazene and triazene polymers A solution of the test substance in THF with ca. 5% water in a quartz cuvette (d=10 mm) was exposed to a Hg-Xe high pressure lamp (100 W) at a distance of 50 cm without image-forming optical elements. The photolysis of the triazene functional groups can be monitored by the decrease in their characteristic absorption bands at ca. 320 nm, which had an absorption maximum of ca. A=2 (corresponding to 100%) at the beginning of the exposure.

FIG. 1 shows the photolysis kinetics of a triazene polymer and of its corresponding monomeric model compound as a comparison. The residue from the irradiated polymer obtained after drying (blowing) the solvent is completely water-soluble. This shows that water-soluble fragments of the water-insoluble polymer are formed.

A very uniform and clear, light-yellow film of several μm thickness is obtained by drying a drop of the THF solution of the triazene polymer on a glass slide.

3.2 Pentazadiene and pentazadiene polymers

Figure 2:
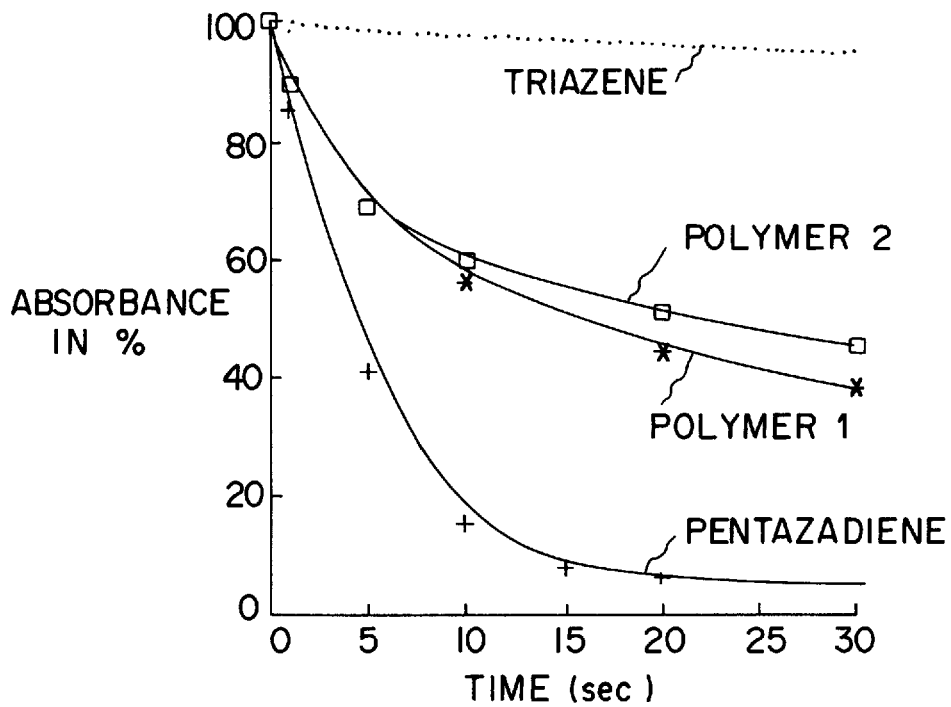
FIG. 2 shows the photolysis kinetics of two pentazadiene polymers compared to a monomeric pentazadiene and a monomeric triazene.
Figure 2A:
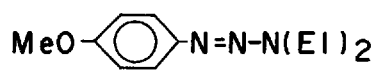
Figure 2B:
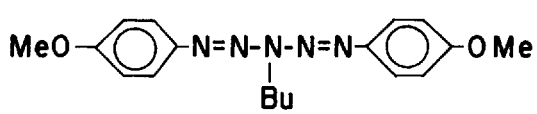
Figure 2C:
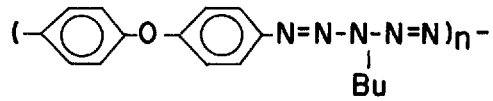
Figure 2D:
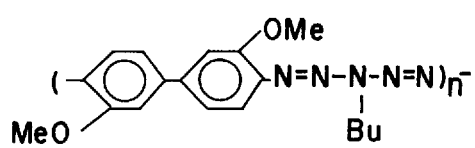

The experiment was carried out as described in example 3.1. FIG. 2 shows the time course of the photolysis kinetics for the two pentazadiene polymers shown there in comparison to a monomeric pentazadiene and a monomeric triazene. The residue from the polymer irradiation is again readily water-soluble. In addition there is a good film formation.

3.3 Pentazadiene and pentazadiene polymers when exposed to white light

The experiment is carried out as in example 1 and example 2. However a commercial fluorimeter of a much weaker intensity was used for the irradiation instead of the Hg-Xe high pressure lamp, i.e. ca. 300 mW almost uniformly distributed from 250 to 750 nm falls on the sample i.e. ca. 30 to 40 mW in the region of the absorption bands at The diazotization of 3,4,5-(trimethoxy)aniline was carried out according to the instructions of example 1. The bis-diazonium salt solution obtained in this way was added to an aqueous solution of 0.0025 mol of the amino-terminal polyethylene glycol (4.75 g) and 8.0 g $Na_2CO_3$ cooled to 0° C. The product was precipitated as a beige-orange solid after stirring for 1 hour at 0° C. It can subsequently be filtered and dried.

We claim:

1. Triazene polymer with the linking unit

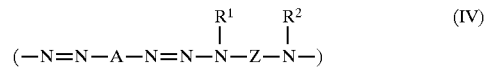

or pentazadiene polymer with the linking unit

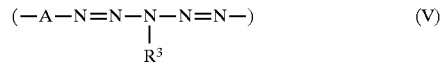

in which A is the residue of a bifunctional aromatic or heteroaromatic amino compound after diazotization and subsequent reaction of the two amino groups, Z represents a non-aromatic hydrocarbon group which is unsubstituted or substituted with ether or an alkylamino bridge or a polymeric residue derived from an amino-functional polymer selected from the group consisting of polyethylenes, poly(allyl)amines, polyethers, polyethylenimines, polysaccharides and polypeptides, $R^1$, $R^2$, and $R^3$ are the same or different and each represents hydrogen, an aliphatic, unsaturated or/and aromatic hydrocarbon group which is unsubstituted or substituted with aryl, heteroaryl, o-alkyl, carboxl groups, halogen, CN, thioether, dialkyl-amino groups, sulfonic acid groups, $C_1$–$C_4$ alkyl, $C_1$–$C_4$ alkoxy, aryloxy, N=N-aryl, or carboxylic acid groups or a polymeric residue derived from an amino-functional polymer selected from the group consisting of polyethylenes, poly(allyl)amines, polyethers, polyethylenimines, polysaccharides and polypeptides, wherein said polymer contains at least two triazene or pentazadiene groups.

2. Polymer as claimed in claim 1, wherein Z is a non-aromatic $C_1$–$C_8$ hydrocarbon group which is unsubstituted or substituted.

3. Polymer as claimed in claim 1, wherein $R^1$ and $R^2$ are each hydrogen or a $C_1$–$C_4$ alkyl group.

4. Polymer as claimed in claim 1, wherein $R^3$ is a $C_1$–$C_8$ alkyl group which is unsubstituted or substituted with aryl, heteroaryl, o-alkyl, carboxl groups, halogen, CN, thioether, dialkyl-amino groups, sulfonic acid groups, $C_1$–$C_4$ alkyl, $C_1$–$C_4$ alkoxy, aryloxy, N=N-aryl, or carboxylic acid groups.

5. Triazene or/and pentazadiene polymer obtained by converting a monofunctional aromatic or heteroaromatic amino compound by diazotization to a corresponding mono-diazonium salt and reacting said salt with an amino-functional polymer in a condensation reaction to produce a triazene or/and pentadiene polymer, wherein said polymer contains at least two triazene or pentazadiene groups and wherein the solubility of said polymer is controlled by light exposure.

* * * * *

UNITED STATES PATENT AND TRADEMARK OFFICE
CERTIFICATE OF CORRECTION

PATENT NO. : 5,770,685
DATED : June 23, 1998
INVENTOR(S) : Stebani et al.

It is certified that error appears in the above-identified patent and that said Letters Patent is hereby corrected as shown below:

On the title page:

Item [54], line 2, delete "TRIAZENEDOR/AND" insert therefor

-- TRIAZENE OR/AND --

Signed and Sealed this

Eighth Day of September, 1998

Attest:

BRUCE LEHMAN

*Attesting Officer*     *Commissioner of Patents and Trademarks*